US008872201B2

(12) United States Patent
Kim et al.

(10) Patent No.: US 8,872,201 B2
(45) Date of Patent: Oct. 28, 2014

(54) ORGANIC LIGHT EMITTING DIODE DISPLAY

(75) Inventors: Gun-Shik Kim, Yongin (KR); Jun-Sik Oh, Yongin (KR); Jang-Seok Ma, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 226 days.

(21) Appl. No.: 13/069,920

(22) Filed: Mar. 23, 2011

(65) Prior Publication Data
US 2012/0104430 A1    May 3, 2012

(30) Foreign Application Priority Data

Oct. 28, 2010   (KR) .................. 10-2010-0106073

(51) Int. Cl.
*H01L 29/205*    (2006.01)
*H01L 51/52*    (2006.01)

(52) U.S. Cl.
CPC ........ *H01L 51/5268* (2013.01); *H01L 51/5284* (2013.01)
USPC ............................................ 257/91

(58) Field of Classification Search
USPC ...................... 257/89, 91, E51.018
See application file for complete search history.

(56) References Cited

U.S. PATENT DOCUMENTS

2007/0132378 A1*   6/2007   Cok et al. ............... 313/506

FOREIGN PATENT DOCUMENTS

| JP | 2010-092666 A | 4/2010 |
| KR | 10-2006-0094160 A | 8/2006 |
| KR | 10-2006-0128286 A | 12/2006 |
| KR | 10-2010-0029885 A | 3/2010 |
| KR | 10-2010-0047208 A | 5/2010 |

\* cited by examiner

*Primary Examiner* — Elias M Ullah
(74) *Attorney, Agent, or Firm* — Knobbe, Martens, Olson & Bear, LLP

(57) ABSTRACT

An organic light emitting diode (OLED) display is disclosed. In one embodiment, the OLED display includes i) a substrate having first and second surfaces opposing each other and ii) an organic light emitting diode (OLED) formed over the substrate, wherein the OLED is closer to the first surface than the second surface of the substrate. The display may also include i) a light scattering layer formed between the first surface of the substrate and the organic light emitting diode and ii) a light absorbing layer formed between the first surface of the substrate and the light scattering layer or on the second surface of the substrate.

10 Claims, 7 Drawing Sheets

ORGANIC LIGHT EMITTING DIODE DISPLAY

RELATED APPLICATIONS

This application claims priority to and the benefit of Korean Patent Application No. 10-2010-0106073 filed in the Korean Intellectual Property Office on Oct. 28, 2010, the entire contents of which are incorporated herein by reference.

BACKGROUND

1. Field

The described technology generally relates to an organic light emitting diode (OLED) display, and more particularly, to an organic light emitting diode (OLED) display suppressing reflection by external light.

2. Description of the Related Technology

An organic light emitting diode (OLED) display is a self-emitting display device which has an organic light emitting diode emitting light to display an image. Light is emitted when excitons generated by combining electrons and holes in an organic emission layer fall from an excited state to a ground state, and the light from a matrix of OLEDs results in an image.

However, when an OLED display is used in high intensity lighting conditions, the generation of a black image and an overall image contrast are reduced due to reflection of light received from the environment.

The above information disclosed in this Background section is only for enhancement of understanding of the background of the described technology and therefore it may contain information that does not form the prior art that is already known in this country to a person of ordinary skill in the art.

SUMMARY

One inventive aspect is an organic light emitting diode (OLED) display having advantages of improving a contrast characteristic by suppressing reflection of external light.

Another aspect is an organic light emitting diode (OLED) display including: a substrate an organic light emitting diode formed on the substrate; a light scattering layer formed between the substrate and the organic light emitting diode; and a light absorbing layer disposed between the substrate and the light scattering layer or on an opposite surface to a surface of the substrate facing the organic light emitting diode.

The light scattering layer may include a scattering material.

At least two layers of the light scattering layers may be disposed.

The light scattering layer may be adjacent to the substrate and interfaces where the light scattering layers and the substrate are in contact with each other may be formed in uneven structures, respectively.

The light scattering layer may have a relatively higher refractive index than the substrate.

The light absorbing layer may have relatively higher transmittance for blue light than for red light or green light by 10% to 30%.

The light absorbing layer may include at least one light absorbing material of a black inorganic material, a black organic material, and metal.

The light absorbing layer may be disposed on an opposite surface to a surface of the substrate facing the organic light emitting diode and the light absorbing layer may have a moth-eye structure.

The light absorbing layer may be disposed on an opposite surface to the surface of the substrate facing the organic light emitting diode and the light absorbing layer may be subjected to anti-reflection coating or low refraction coating.

DETAILED DESCRIPTION

Figure 1:
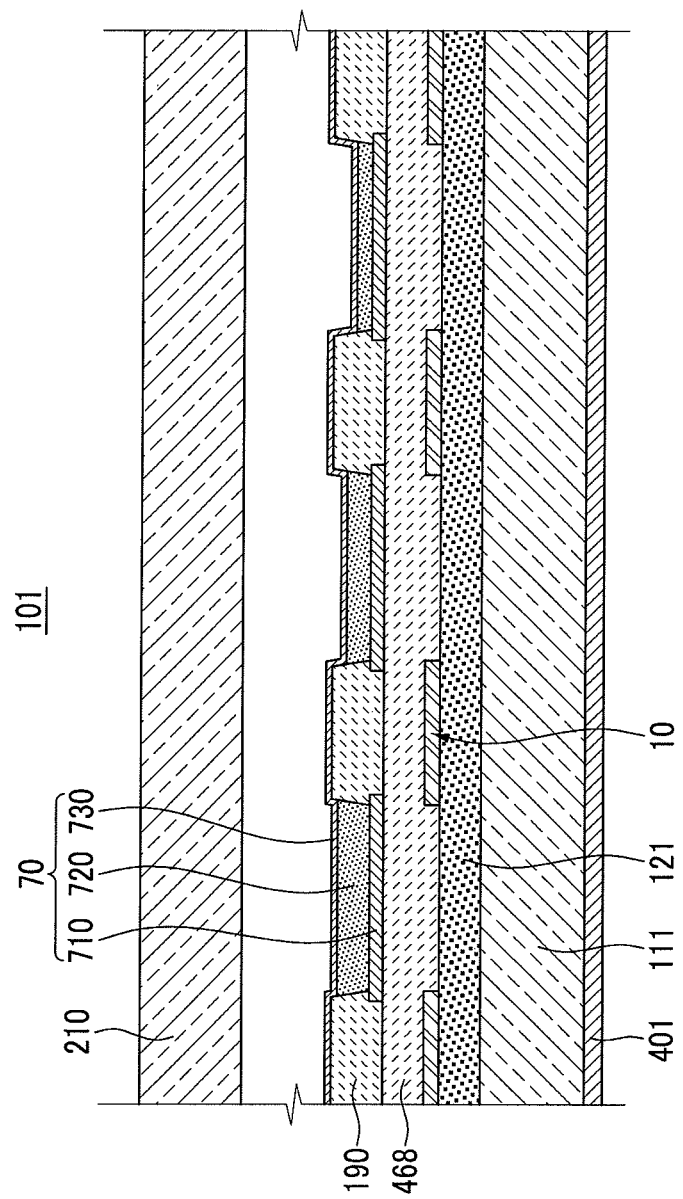
FIG. 1 is a cross-sectional view of an organic light emitting diode (OLED) display according to a first embodiment.

Embodiments will be described more fully hereinafter with reference to the accompanying drawings. As those skilled in the art would realize, the described embodiments may be modified in various different ways.

Further, like reference numerals designate like elements throughout the specification. In addition, in describing various embodiments, components different from the previous embodiments will be mainly described.

In addition, the size and thickness of each component shown in the drawings are arbitrarily shown for understanding and ease of description, and not considered limiting.

In the drawings, the thickness of layers, films, panels, regions, etc., may be exaggerated for clarity. In the drawings, for understanding and ease of description, the thicknesses of some layers and areas may be exaggerated. It will be understood that when an element such as a layer, film, region, or substrate is referred to as being "on" another element, it can be directly on the other element or intervening elements may also be present.

Hereinafter, an organic light emitting diode (OLED) display 101 according to a first embodiment will be described with reference to FIGS. 1 and 2.

As shown in FIG. 1, the organic light emitting diode (OLED) display 101 according to the first embodiment includes a substrate 111, a light absorbing layer 401, a light scattering layer 121, and an organic light emitting diode (OLED) 70. In addition, the organic light emitting diode (OLED) display 101 further includes a thin film transistor (TFT) 10 driving the organic light emitting diode 70, at least one insulating layer 468 disposed between the organic light emitting diode 70 and the substrate 111, a pixel defining layer 190 classifying the organic light emitting diode 70 by the pixel unit, and a sealing member 210 facing the substrate 111 and covering the organic light emitting diode 70. Herein, the pixel is a minimum unit which the organic light emitting diode (OLED) display 101 displays an image.

The substrate 111 may be formed by a transparent insulating substrate made of glass, quartz, ceramic, etc., or a transparent flexible substrate made of plastic and the like.

The organic light emitting diode 70 includes a first electrode 710, an organic emission layer 720, and a second electrode 730. The first electrode 710 is an anode which is a hole injection electrode and the second electrode 730 is a cathode which is an electron injection electrode. However, the first embodiment is not limited thereto. That is, the first electrode 710 may be the cathode and the second electrode 730 may be the anode.

In the first embodiment, the organic light emitting diode (OLED) display 101 has a bottom emission type structure. That is, light emitted from the organic light emitting diode 70 transmits the substrate 111 and is emitted to the outside, thereby displaying the image.

Accordingly, the first electrode 710 of the organic light emitting diode 70 is formed by a transparent electrode or a semi-transmissive electrode. Further, the second electrode 720 of the organic light emitting diode 70 is formed by a reflective electrode.

The transparent electrode includes at least one of Indium Tin Oxide (ITO), Indium Zinc Oxide (IZO), Zinc Indium Tin Oxide (ZITO), Gallium Indium Tin Oxide (GITO), Indium Oxide ($In_2O_3$), Zinc Oxide (ZnO), Gallium Indium Zinc Oxide (GIZO), Gallium Zinc Oxide (GZO), Fluorine Tin Oxide (FTO), and Aluminum-Doped Zinc Oxide (AZO).

The reflective electrode and the semi-transmissive electrode may be made of metal. In this case, the reflective electrode and the semi-transmissive electrode are discriminated from each other depending on a thickness. In general, the semi-transmissive electrode has a thickness in the range of about 5 nm to about 100 nm and the reflective electrode has a thickness relatively larger than the semi-transmissive electrode. According to the thickness of the semi-transmissive electrode, transmittance and reflectance of light vary. In one embodiment, as the thickness of the semi-transmissive electrode becomes smaller, the transmittance of light increases and as the thickness of the semi-transmissive electrode becomes larger, the transmittance of light decreases. Transmittance of light according to the thickness may be different for each metal. The above range (about 5 nm to about 100 nm) may provide an optimum balance between the transmittance of light and the electric characteristic of the semi-transmissive electrode. For example, when the thickness of the semi-transmissive electrode is less than or equal to about 100 nm, the transmittance of light is enhanced. Also, when the thickness of the semi-transmissive electrode is greater than or equal to about 5 nm, an electric characteristic is not substantially deteriorated. However, depending on the embodiment, the thickness of the semi-transmissive electrode may be greater than about 100 nm or less than about 5 nm.

The organic emission layer 720 may be formed of multiple layers including a light emitting layer, a hole-injection layer (HIL), a hole-transporting layer (HTL), an electron-transporting layer (ETL), and an electron-injection layer (EIL). Among above-mentioned layers, the rest layers other than the light emitting layer may be omitted depending on the embodiment. In the case where the organic emission layer 720 includes all the above-mentioned layers, the hole-injection layer is disposed on the first electrode 710 which is the hole injection electrode and the hole-transporting layer, the electron-transporting layer, and the electron-injection layer are sequentially stacked thereon. In addition, the organic emission layer 720 may further include other layers as necessary.

Further, when the first electrode 710 is formed by the semi-transmissive electrode and the second electrode 730 is formed by the reflective electrode, the organic light emitting diode (OLED) display 101 can improve use efficiency of light, that is, luminance by using a microcavity effect. The microcavity effect may be maximized by adjusting the distance between the first electrode 710 and the second electrode 730 of the organic light emitting diode 70. In addition, in order to maximize the microcavity effect, the distance between the first electrode 710 and the second electrode 730 varies depending on colors of light emitted by the organic light emitting diode 70. The distance between the first electrode 710 and the second electrode 730 for maximizing the microcavity effect is relatively largest in the organic light emitting diode 70 emitting red-based light and smallest in the organic light emitting diode 70 emitting blue-based light Accordingly, when cavity layers having different thicknesses are disposed between the first electrode 710 and the second electrode 730 depending on colors of emitting light, it is possible to effectively improve luminance efficiency to power. That is, the cavity layer having the relatively largest thickness is disposed in the organic light emitting diode 70 emitting red-based light and the cavity layer having the relatively smallest thickness is disposed or the cavity layer may be omitted in the organic light emitting diode 70 emitting red-based light or the cavity layer emitted.

The cavity layer may be separately formed between the first electrode 710 and the second electrode 730 and formed by thickening one or more layers of the hole-injection layer (HIL), the hole-transporting layer (HTL), the electron-transporting layer (ETL), and the electron-injection layer (EIL) included in the organic emission layer 720.

In the organic light emitting diode (OLED) display 101 according to the first embodiment, as shown in FIG. 1, the organic light emitting diode 70 emitting red-based light has the relatively largest thickness and the organic light emitting diode 70 emitting blue-based light has the relatively smallest thickness.

The pixel defining layer 190 has an opening exposing at least a part of the first electrode 710. The organic emission layer 720 emits light in the opening of the pixel defining layer 190. That is, the opening of the pixel defining layer 190 defines a light emitting region actually generating light.

The sealing member 210 is attached and sealed to the substrate 111 by a sealant (not shown) disposed around the edge. The sealing member 210 may be formed of a transparent insulating substrate made of glass, quartz, ceramic, plastic, etc. or a metallic material.

However, the sealing member 210 is not limited to the first embodiment. Therefore, the sealing member 210 may be formed by an encapsulation thin-film structure in which at least one of a transparent insulating organic layer and a transparent insulating inorganic layer is stacked.

Figure 2:
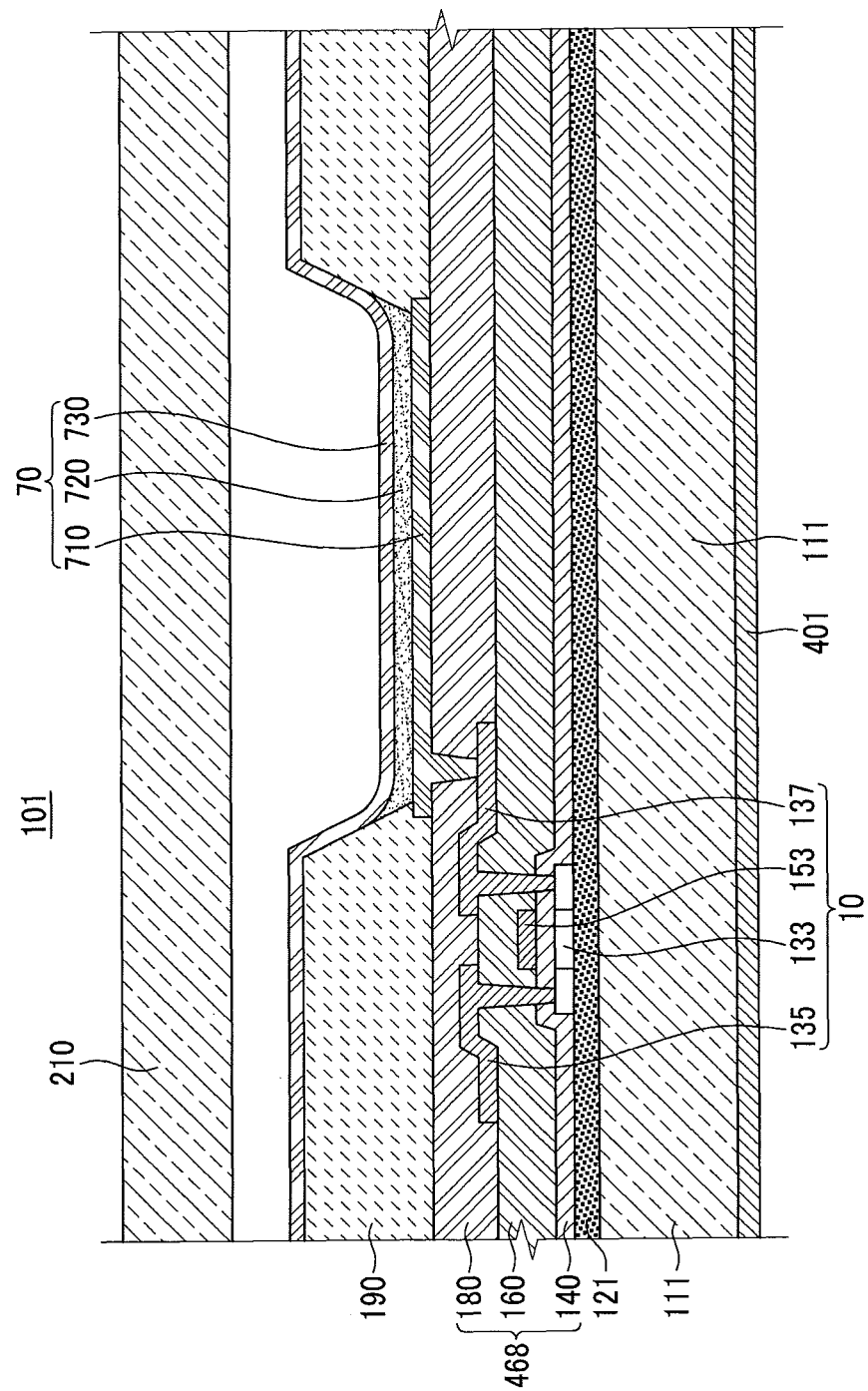
FIG. 2 is a partial exploded cross-sectional view of the organic light emitting diode (OLED) display of FIG. 1.

As shown in FIG. 2, the thin film transistor 10 includes a semiconductor layer 133, a gate electrode 153, a source electrode 135, and a drain electrode 137. The drain electrode 137 of the thin film transistor 10 may be electrically connected with the first electrode 710 of the organic light emitting diode 70.

In addition, the thin film transistor 10 in FIG. 2 includes a polycrystalline semiconductor layer and has a top gate structure in which the gate electrode 153 is formed on the semiconductor layer 133. However, the first embodiment is not limited thereto. For example, the thin film transistor 10 may be modified in various structures known to those skilled in the art.

Further, a plurality of insulating layers 468 such as a gate insulating layer 140, an interlayer insulating layer 160, and a planarization layer 180 are disposed between the substrate 111 and the organic light emitting diode 70. The insulating layers 468 may be made of various inorganic materials or organic materials known to those skilled in the art.

The light scattering layer 121 is disposed between the substrate 111 and the organic light emitting diode 70. In FIGS. 1 and 2, the light scattering layer 121 is disposed between the thin film transistor and the substrate 111, but the first embodiment is not limited thereto. That is, the light scattering layer 121 may be any one of the plurality of insulating layers 468.

Meanwhile, the light scattering layer 121 may act as a buffer layer at the same time. The buffer layer prevents moisture or impurities generated from the substrate 111 from diffused and infiltrated, flattens the surface, and helps crystallization by controlling a transferring speed of heat in a crystallizing process for forming the semiconductor layer 133.

In the first embodiment, the light scattering layer 121 contains a scattering material scattering light. As the scattering material, various materials known to those skilled in the art may be used.

In the first embodiment, the light absorbing layer 401 is disposed on an opposite surface to a surface of the substrate facing the organic light emitting diode 70, that is, an outer surface of the substrate 111.

The light absorbing layer 401 includes at least one light absorbing material of a black inorganic material, a black organic material, and metal. For example, the light absorbing material may be carbon black, polyene-based pigment, azo-based pigment, azomethine-based pigment, diimmonium-based pigment, phthalocyanine-based pigment, quinone-based pigment, indigo-based pigment, thioindigo-based pigment, dioxadin-based pigment, quinacridone-based pigment, isoindolinone-based pigment, metal oxide, metal complex, and aromatic hydrocarbons, and the like.

In addition, the light absorbing layer 401 has relatively higher transmittance for blue light than for red light or green light by about 10% to about 30%. Accordingly, luminance of blue light having relatively lower luminous efficiency may be improved.

In addition, the outer surface of the light absorbing layer 401, that is, the opposite surface to the surface facing the substrate 111 may be subjected to anti-reflection coating or low refraction coating. When the light absorbing layer 401 is subjected to the anti-reflection coating or low refraction coating, reflection of light may be effectively suppressed.

According to the configurations described above, the organic light emitting diode (OLED) display 101 according to the first embodiment can improve a contrast characteristic by suppressing reflection by external light.

Hereinafter, a second embodiment will be described with reference to FIG. 3.

Figure 3:
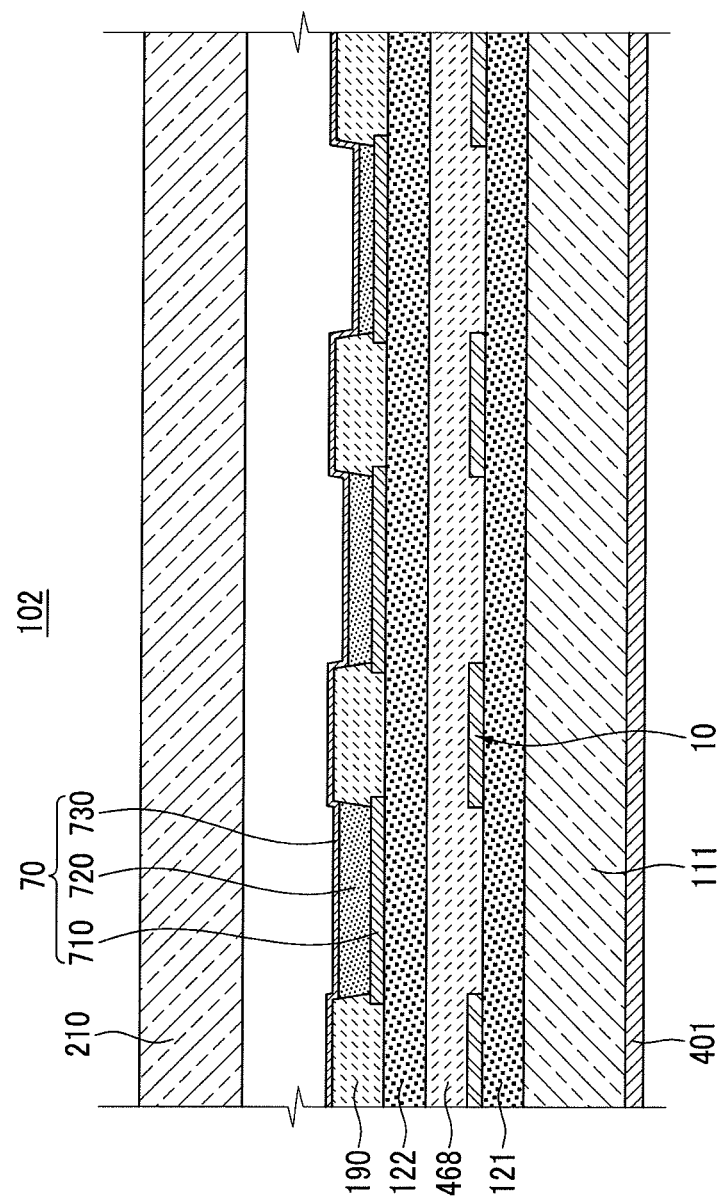
FIG. 3 is a cross-sectional view of an organic light emitting diode (OLED) display according to a second embodiment.

As shown in FIG. 3, the organic light emitting diode (OLED) display 102 according to the second embodiment includes a plurality of light scattering layers 121 and 122. For example, the organic light emitting diode (OLED) display 102 may include a first light scattering layer 121 and a second light scattering layer 122. In FIG. 3, the organic light emitting diode (OLED) display 102 includes two light scattering layers 121 and 122, but the second embodiment is not limited thereto.

At least one of the first light scattering layer 121 and the second light scattering layer 122 may be one of several insulating layers 468 disposed between the substrate 111 and the organic light emitting diode 70 and disposed between the substrate 111 and the thin film transistor 10.

According to the configurations described above, the organic light emitting diode (OLED) display 102 according to the second embodiment can also improve a contrast characteristic by suppressing reflection by external light.

Hereinafter, a third embodiment will be described with reference to FIG. 4.

Figure 4:
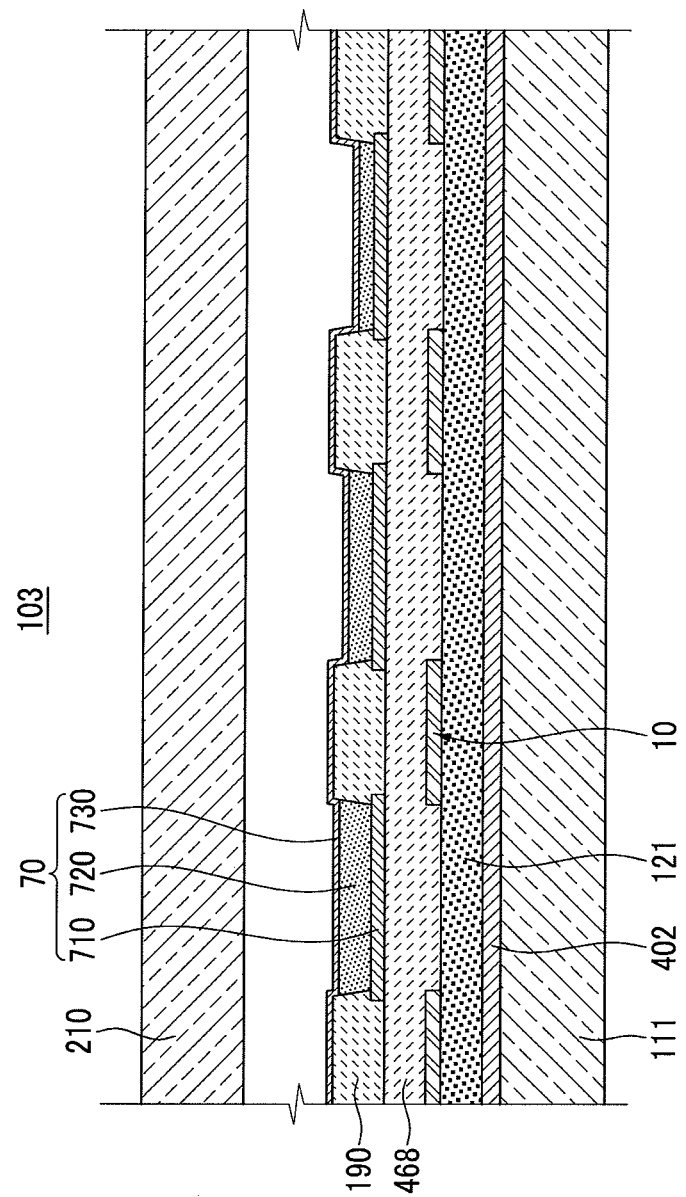
FIG. 4 is a cross-sectional view of an organic light emitting diode (OLED) display according to a third embodiment.

As shown in FIG. 4, the organic light emitting diode (OLED) display 103 according to the third embodiment includes a light absorbing layer 402 disposed between the substrate 111 and the light scattering layer 121.

As such, although the light absorbing layer 402 is formed in a sealed space between the substrate 111 and the sealing member 210, it is possible to improve a contrast characteristic by suppressing reflection by external light.

Hereinafter, a fourth embodiment will be described with reference to FIG. 5.

Figure 5:
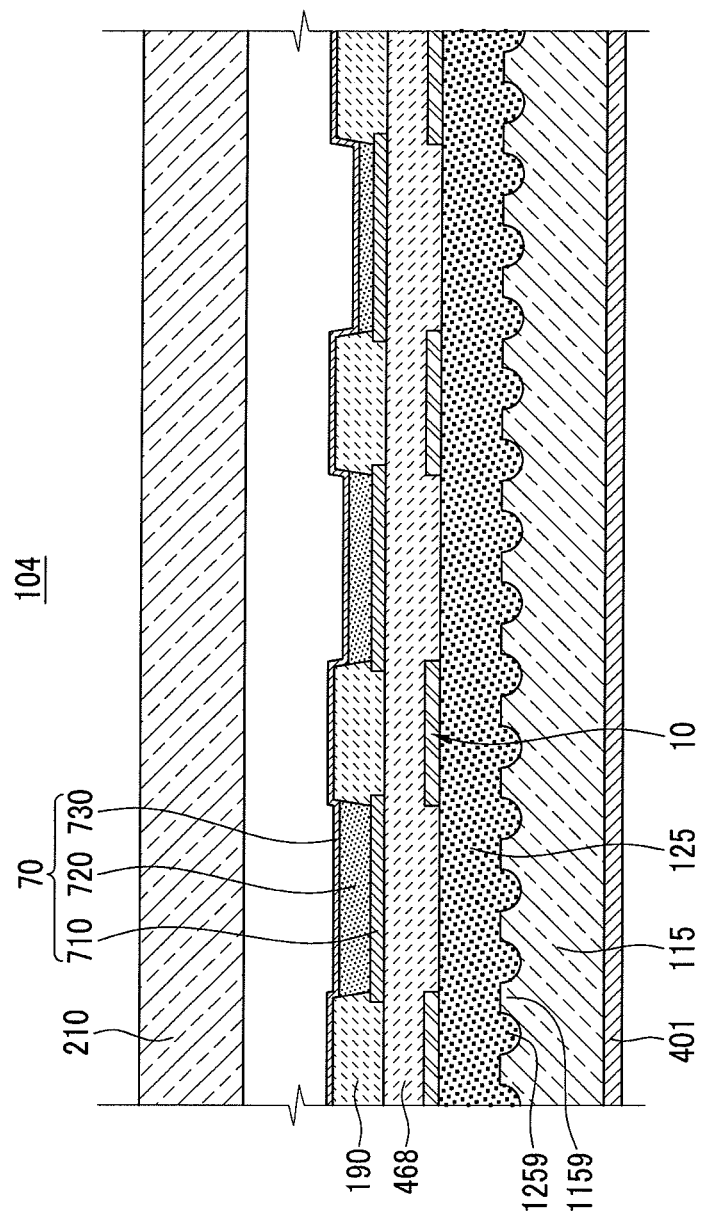
FIG. 5 is a cross-sectional view of an organic light emitting diode (OLED) display according to a fourth embodiment.

As shown in FIG. 5, the organic light emitting diode (OLED) display 104 according to the fourth embodiment includes a light scattering layer 125 adjacent to a substrate 115. In addition, an interface where the light scattering layer 125 and the substrate 115 are in contact with each other is formed in an uneven structure. That is, protrusions 1159 and 1259 are formed on one surface of the light scattering layer 125 which is in contact with the substrate 115 and one surface of the substrate 115 which is in contact with the light scattering layer 125, respectively. In this case, the light scattering layer 125 has a relatively higher refractive index than the substrate 115. As such, light is scattered on the interface having the uneven structure where the light scattering layer 125 and the substrate 115 are in contact with each other. In addition, light may further be scattered by a difference in refractive index between the light scattering layer 125 and the substrate 115. The uneven structure is not limited to the structure shown in FIG. 5 and may be modified into various structures capable of scattering light.

Meanwhile, in the fourth embodiment, the light scattering layer 125 may include a scattering material as well as the uneven structure However, the fourth embodiment is not limited thereto. Accordingly, in the fourth embodiment, the light scattering layer 125 may not include the scattering material.

According to the configurations described above, the organic light emitting diode (OLED) display 104 according to the fourth embodiment can also improve a contract characteristic by effectively suppressing reflection by external light.

Hereinafter, a fifth embodiment will be described with reference to FIG. 6.

Figure 6:
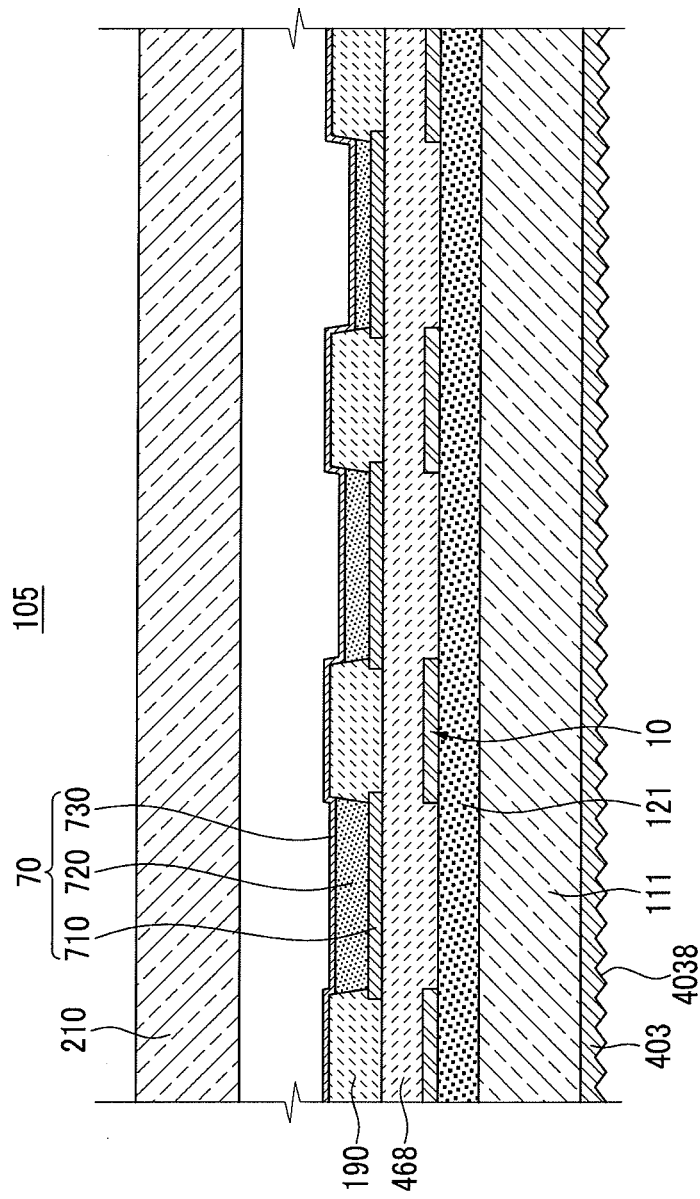
FIG. 6 is a cross-sectional view of an organic light emitting diode (OLED) display according to a fifth embodiment.

As shown in FIG. 6, the organic light emitting diode (OLED) display 105 according to the fifth embodiment includes a light absorbing layer 403 disposed on an opposite surface to a surface of the substrate 111 facing the organic light emitting diode 70, that is, an outer surface of the substrate 111. In addition, an outer surface of the light absorbing layer 403 is formed by a moth-eye structure 4038. Accordingly, the light absorbing layer 403 also suppresses reflection of light.

According to the configurations described above, the organic light emitting diode (OLED) display 105 according to the fifth embodiment further effectively suppresses reflection by external light, thereby improving contrast characteristic.

Hereinafter, referring to FIG. 7, Experimental Example according to the first embodiment is compared with Comparative Examples as described below.

Experimental Example includes both the light scattering layer 121 and the light absorbing layer 401 formed according to the first embodiment. In contrast, Comparative Example 1 does not include the light scattering layer 121 and Comparative Example 2 does not include both the light scattering layer 121 and the light absorbing layer 401 as compared with Experimental Example.

Figure 7:
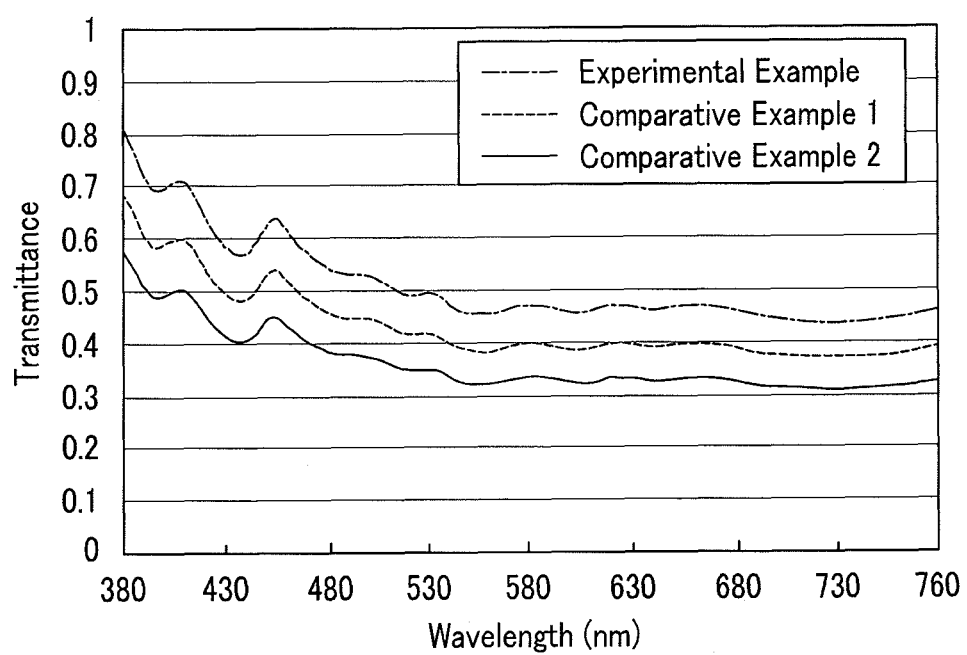
FIG. 7 is a graph illustrating transmittances of Experimental Example and Comparative Example according to an embodiment.

As shown in FIG. 7, Experimental Example has relatively higher transmittance than Comparative Example 1 and Comparative Example 2. That is, Experimental Example effectively suppresses reflection of light as compared with Comparative Example 1 and Comparative Example 2.

According to at least one of the disclosed embodiments, an organic light emitting diode (OLED) display can improve a contrast characteristic by suppressing reflection of external light.

While this disclosure has been described in connection with certain embodiments, it is to be understood that the disclosed embodiments are not considered limiting. Accordingly, various modifications and equivalent arrangements are included within the spirit and scope of the appended claims.

What is claimed is:

1. An organic light emitting diode (OLED) display, comprising:
    a substrate having first and second surfaces opposing each other;
    an organic light emitting diode (OLED) formed over the substrate, wherein the OLED is closer to the first surface than the second surface of the substrate;
    a light scattering layer formed between the first surface of the substrate and the organic light emitting diode;
    a light absorbing layer formed between the first surface of the substrate and the light scattering layer or on the second surface of the substrate; and
    a thin film transistor separated from the OLED and formed on the light scattering layer, wherein the thin film transistor comprises bottom and top surfaces opposing each other, wherein the bottom surface of the thin film transistor contacts the light scattering layer, and wherein the top surface of the thin film transistor is farther from the substrate than the light scattering layer.

2. The organic light emitting diode (OLED) display of claim 1, wherein the light scattering layer is formed at least partially of a scattering material.

3. The organic light emitting diode (OLED) display of claim 2, wherein the light scattering layer comprises at least two sub-light scattering layers.

4. The organic light emitting diode (OLED) display of claim 1, wherein the light scattering layer is adjacent to the substrate, and
    wherein interfaces where the light scattering layers and the substrate are in contact with each other are formed in uneven structures, respectively.

5. The organic light emitting diode (OLED) display of claim 4, wherein the light scattering layer has a relatively higher refractive index than the substrate.

6. The organic light emitting diode (OLED) display of claim 1, wherein the light absorbing layer has relatively higher transmittance for blue light than for red light or green light by about 10% to about 30%.

7. The organic light emitting diode (OLED) display of claim 1, wherein the light absorbing layer includes a light absorbing material formed at least one of a black inorganic material, a black organic material, and metal.

8. The organic light emitting diode (OLED) display of claim 1, wherein the light absorbing layer is formed on the second surface of the substrate, and
    wherein the light absorbing layer has a moth-eye structure.

9. The organic light emitting diode (OLED) display of claim 1, wherein the light absorbing layer is formed on the second surface of the substrate, and
    wherein the light absorbing layer is coated with an anti-reflection material or a low refraction material.

10. An organic light emitting diode (OLED) display, comprising:
    a substrate having first and second surfaces opposing each other;
    an organic light emitting diode (OLED) formed over the substrate, wherein the OLED is closer to the first surface than the second surface of the substrate;
    a light scattering layer formed between the first surface of the substrate and the organic light emitting diode; and
    a light absorbing layer formed between the first surface of the substrate and the light scattering layer or on the second surface of the substrate, wherein the light absorbing layer is continuously formed along one of the first and second surfaces of the substrate, wherein the light absorbing layer has a height measured in a first direction extending from the substrate to the OLED and a width measured in a second direction substantially perpendicular to the first direction, and wherein the width of the light absorbing layer is substantially greater than the height of the light absorbing layer.

* * * * *